Figure 1:
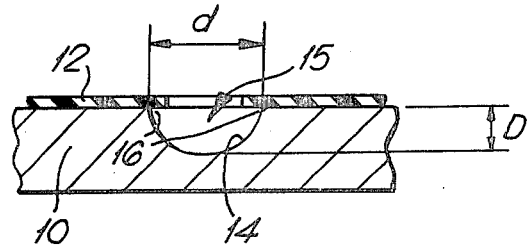

United States Patent [19]

Hustler

[11] 4,226,686
[45] Oct. 7, 1980

[54] METHOD OF FORMING A POROUS SHEET

[75] Inventor: David Hustler, Burnley, England

[73] Assignee: Rolls-Royce Limited, London, England

[21] Appl. No.: 60,680

[22] Filed: Jul. 25, 1979

[30] Foreign Application Priority Data

Aug. 5, 1978 [GB] United Kingdom ............... 32391/78

[51] Int. Cl.³ .......................... C25F 3/02; C25F 3/14
[52] U.S. Cl. .......................... 204/129.55; 204/129.65
[58] Field of Search ........... 204/129.1, 129.55, 129.65

[56] References Cited

U.S. PATENT DOCUMENTS

| 3,359,192 | 12/1967 | Heinrich | 204/129.65 |
| 3,471,338 | 10/1969 | Trachtenberg | 204/129.65 |
| 3,738,879 | 6/1973 | von Siemens | 204/129.65 |

FOREIGN PATENT DOCUMENTS 1009518  11/1965  United Kingdom ............... 204/129.65

Primary Examiner—T. M. Tufariello
Attorney, Agent, or Firm—Cushman, Darby & Cushman

[57] ABSTRACT

Sheet metal plate has grooves formed in a side, by the electro chemical/photo resist method. Holes are formed in the same way, in the groove bottoms and pass through the metal thickness. In order to ensure that the holes have substantially parallel, dimensionally accurate walls, the sheet thickness to hole diameter ratio, is effectively reduced by first forming the holes to half depth in one side of the sheet, then forming grooves in the same side of the sheet in which the half holes are formed, so as to remove the half holes but leave depressions in the groove bottom at the positions where the half holes had been previously formed, then forming the hole proper for the holes by removing the metal from the opposite side of the sheet.

2 Claims, 4 Drawing Figures

METHOD OF FORMING A POROUS SHEET

This invention relates to a method of performing a photo resist/electro chemical machining process.

The invention particularly relates to a method of making a perforated metal sheet as defined hereinafter, by said process.

In the context of the present invention, a perforated metal sheet is one in which intersecting grooves are produced in a side of a sheet and holes are produced in the bottoms of the grooves, the holes extending to and out of, the side of the sheet opposite that side containing the grooves.

The perforate sheet as defined herein, is utilised for inter alia, the construction of a combustion chamber for a gas turbine engine and in operation in that environment, air from a compressor enters the holes and diverges along the grooves, before passing out of further holes in an associated sheet, to cool the interior of the combustion chamber.

An economic way to produce, large quantities of holes and grooves is by the process known as photo resist/electrochemical machining which per se is well known in the art. However, the process has a drawback in that it is a difficult process to control as regards the achieving of accurate dimensions e.g. the close control of hole diameter. In the context of the present invention this is most important, for a combustion chamber must have the right quantity of air to achieve efficient cooling, yet avoid inefficient mixing with fuel.

The difficulty lies in the ratio of sheet thickness to the required diameter of hole. Where this ratio is 1:1 or more, i.e. relatively thick sheet to small hole diameter, then by the time the electrolyte used in the process, has penetrated the full sheet thickness, its inherent characteristic of simultaneously etching sideways, thereby undercutting the photo resist on the sheet surface, enlarges the hole walls to an unacceptable size and profile.

It is an object of the present invention, to utilise the photo resist/electro chemical machining process, to produce a perforate sheet as herein defined, by effectively reducing the thickness of the sheet relative to the required magnitude of diameter of the holes, before said holes are machined, to enable the production of holes to close tolerances.

According to the present invention there is provided a method of producing a perforate sheet as defined herein, by the photo resist/electro chemical machining process, including the steps of:

(a) producing a pattern of holes in one side of a metal sheet, to a depth of approximately 50% of the sheet thickness so as to effectively reduce its thickness locally, and of a diameter less than the width of grooves to be produced thereafter, (b) producing a number of intersecting grooves in said one side of the sheet, which grooves obviate the holes, local depressions being formed in the groove bottoms, by electro chemical machining action on the hole bottoms, thereby further effectively reducing the sheet thickness locally, then (c) producing a further, identical number of holes in the reverse side of said sheet, and causing them to break into said depressions and continuing the machining until the holes diameters so produced in the groove bottoms, are of the required dimension.

Preferably the sheet thickness is effectively reduced locally, so as to be in the ratio of at most 1:2 with respect to the required hole diameter.

Figure 2:
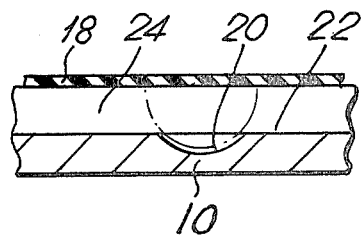
Figure 3:
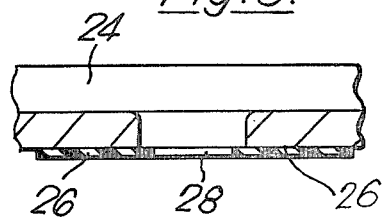
Figure 4:
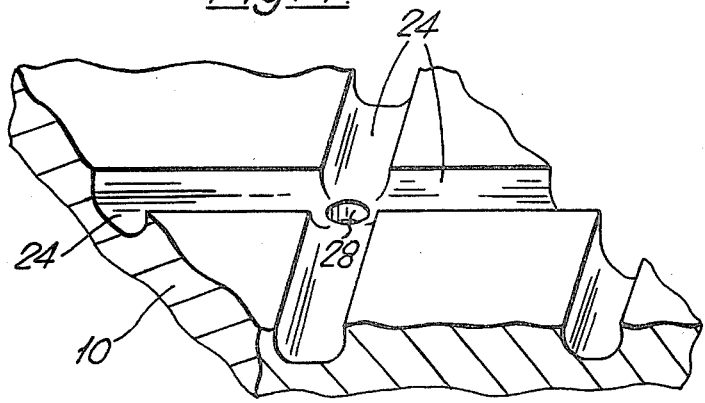

The invention will now be described, by way of example, and with reference to the accompanying drawings in which:

FIG. 1 is a cross sectional view through a metal sheet after a hemispherical hole machining operation has been performed in accordance with the invention, FIG. 2 is the same cross sectional view of FIG. 1 after a groove has been machined in the metal sheet, FIG. 3 is the same cross sectional view of FIGS. 1 and 2, after a hole has been machined in the reverse side of the metal sheet, FIG. 4 is a pictorial part view of a completed metal sheet.

In FIG. 1 a metal sheet 10 has a layer of hardened photo resist material 12 thereon, unhardened portions of which have been washed off, to permit electro chemical machining of holes 15 in the sheet.

The diameter of each uncovered portion of the sheet is small relative to the diameter of each respective hole required, to take account of the characteristic of the machining process, wherein the electrolyte etches in a sideways direction, thus undercutting the photo resist material as indicated at 16.

The process also exhibits a further characteristic by way of forming a hemispherical hole 14, which phenomenum is brought about by the combined progression of the electrolyte both through the sheet and sideways of it. It is this phenomenum which makes it impossible to produce a parallel side hole in a sheet which is of greater thickness than the diameter of the hole to be produced. Accordingly, in the present invention, these first holes are formed for a depth "D" which is approximately half the sheet thickness. The sheet has thus been reduced in thickness locally by approximately 50%.

Referring now to FIG. 2, the sheet 10 has the first hardened layer of photo resist material 12 stripped off and is treated with further photo resist material 18 preparatory to forming a number of intersecting grooves 24. It is arranged that the grooves will be positioned so that their forming removes the holes 15 which were produced in the first step in the operation. However, because the forming of the holes removed metal, the action of the electrolyte when forming grooves 24 will remove further metal from the bottom of each hole. Depressions 20 are thus formed in the bottom 22 of each groove. This has the effect of further reducing the sheet thickness locally.

In a final operation, after stripping of the last mentioned layer of photo resist material 18, a further photo resist application in known manner is made, as shown at 26 in FIG. 3, this time on the opposite side of sheet 10, to that side previously treated. The pattern applied is identical with that applied in the first instance, i.e. a pattern of holes 28 so that on washing away unhardened photo resist material, metal is exposed for machining. On machining being effected, holes are formed which break into the grooves 24 via the depressions. Machining is continued to remove the cusp formed as breakthrough occurs and to achieve the required diameter by sideways etching as described hereinbefore. Eventually the required diameter is reached and it will be found that the holes so produced are substantially parallel sided. This is because the electrolyte has only had relatively thin metal to machine through and the holes produced from that part of the hemisphere 14 of FIG. 1 are nearer to constant diameter than the closed end of the hemisphere.

In FIG. 4, the intersecting grooves 24 and one hole 28 are shown in a typical positional relationship with each other, when a perforate sheet is formed in accordance with the present invention.

It has been found by experiment, that the thinner a sheet can be made relative to the size of hole which is required to be put in the sheet, the more parallel sided the hole can be made. Further, the hole can be made more accurate as to diametral dimension. For example, the following table gives the degree of accuracy which experiment has shown can be expected, when a hole or holes are produced by the method of the present invention in sheet having stated thickness ratios, relative to the required diameter of the hole

|     | Required hole diameter | Sheet Thickness | Ratio | Accuracy |
| --- | --- | --- | --- | --- |
| (a) | .021" | .016" | 1¼:1 | +.006" −.010" |
| (b) | .030" | .016" | 2:1 | +.004" −.003" |
| (c) | .030" | .006" | 5:1 | +.001" −.001" |

I claim:

1. A method of producing a perforate sheet comprising the steps of:
    (a) covering a side of the sheet with a photo resist material and then exposing desired portions of the photo resist material to light so as to harden those portions so exposed;
    (b) washing off the unhardened photo resist material to leave bared sheet portions in a first pattern;
    (c) producing a plurality of holes by an electro chemical machining action on the bared sheet portions of the first pattern, the holes extending to a depth of approximately 50% of the sheet thickness so as to effectively reduce the thickness of the sheet locally, and the holes produced having a diameter less than the width of the grooves to be produced thereafter;
    (d) covering the same side of the sheet with a photo resist material and then exposing other portions of the photo resist material to light so as to harden those portions so exposed;
    (e) washing off the unhardened photo resist material to leave bared sheet portions in a second pattern;
    (f) producing a plurality of intersecting grooves by an electro chemical machining action in the bared sheet portions of the second pattern, which grooves obviate the previously formed holes and leave local depressions formed in the groove bottoms at positions of the previously formed holes thereby further effectively reducing the sheet thickness locally;
    (g) covering the remaining side of the sheet with a photo resist material and then exposing desired portions of the photo resist material to light so as to harden those portions so exposed;
    (h) washing off the unhardened photo resist material on the other side of the sheet to produce bared sheet portions in a pattern identical with the pattern for the holes previously formed;
    (i) and then producing by an electro chemical machining action a pattern of holes identical with the first pattern of holes and causing the holes to break into the depressions and continuing the electro chemical machining action until the diameters of the holes so produced in the groove bottoms are of required dimensions.

2. A method of producing a perforate sheet as claimed in claim 1, wherein the sheet thickness is effectively reduced locally, so as to be in the ratio of at most 1:2 with respect to the required hole diameter.